United States Patent [19]

Jacques et al.

[11] 4,417,943

[45] Nov. 29, 1983

[54] METHOD FOR CONTROLLING THE OXYGEN LEVEL OF SILICON RODS PULLED ACCORDING TO THE CZOCHRALSKI TECHNIQUE

[75] Inventors: Combronde Jacques, Saint Fargeau-Ponthierry; Jean-Claude Felix, Le Chatelet en Brie, both of France

[73] Assignee: International Business Machines Corporation, Armonk, N.Y.

[21] Appl. No.: 266,227

[22] Filed: May 22, 1981

[30] Foreign Application Priority Data

Jun. 26, 1980 [EP] European Pat. Off. ........ 80430013.5

[51] Int. Cl.³ .............................................. C30B 15/22
[52] U.S. Cl. ................................ 156/601; 156/617 SP
[58] Field of Search ......................... 156/617 SP, 601; 422/249, 105

[56] References Cited

U.S. PATENT DOCUMENTS

| | | | |
|---|---|---|---|
| 3,621,213 | 11/1971 | Jen et al. | 156/617 SP |
| 3,669,757 | 6/1972 | Kaufmann et al. | 156/601 |
| 4,239,585 | 12/1980 | Köhl | 156/617 SP |
| 4,344,815 | 8/1982 | Cazarra et al. | 156/617 SP |

*Primary Examiner*—Hiram H. Bernstein
*Attorney, Agent, or Firm*—Joseph E. Kieninger

[57] ABSTRACT

A method for controlling the oxygen concentration profile of a rod of crystalline material such as silicon being pulled from a melt in a crucible includes varying the crucible rotation speed during the pulling process. In a preferred embodiment, the average oxygen concentration profile of a rod pulled at a constant crucible rotation speed is measured and then this information is used in growing another rod by controlling the crucible rotation speed during the pulling process so that its slope is opposite to the slope of the measured average oxygen concentration profile.

4 Claims, 14 Drawing Figures

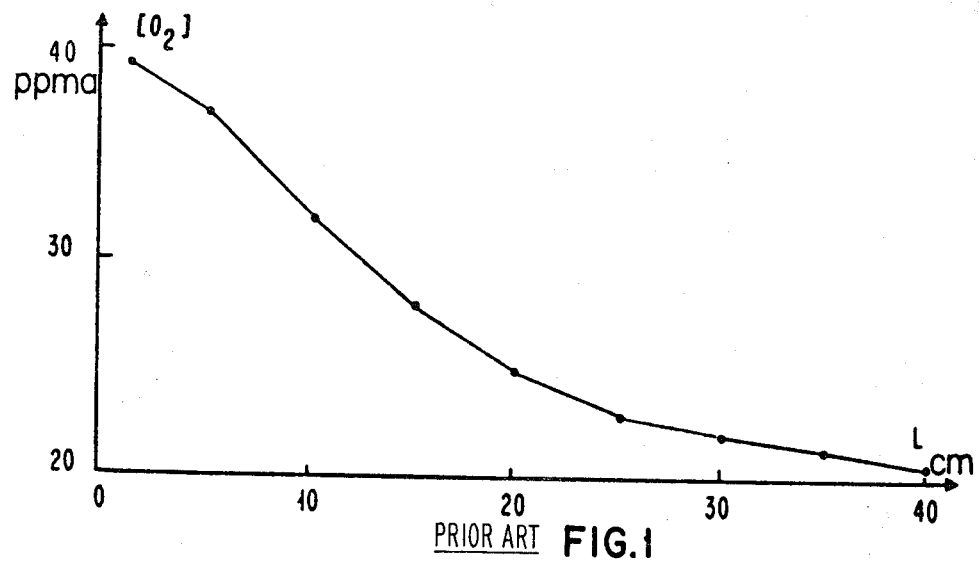
PRIOR ART FIG.1
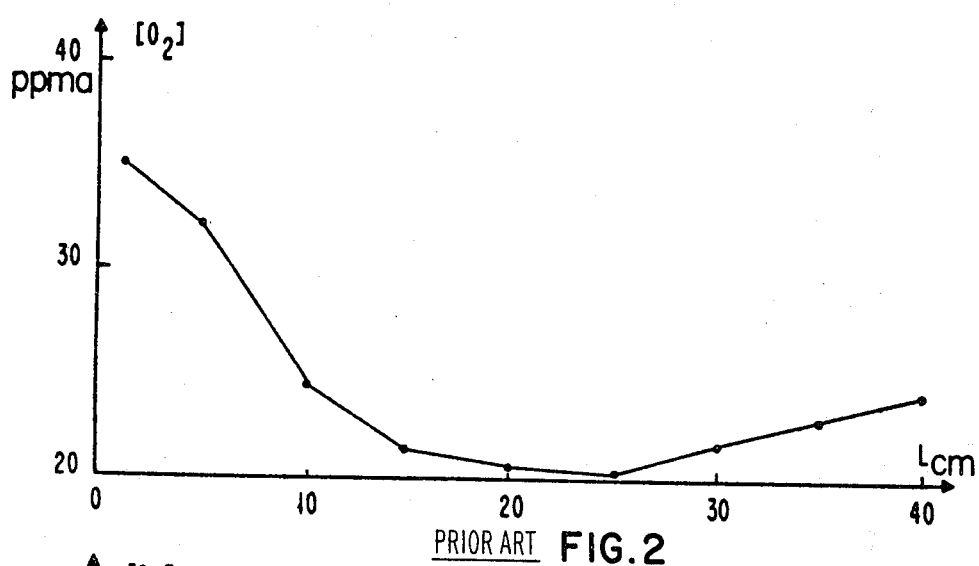
PRIOR ART FIG.2
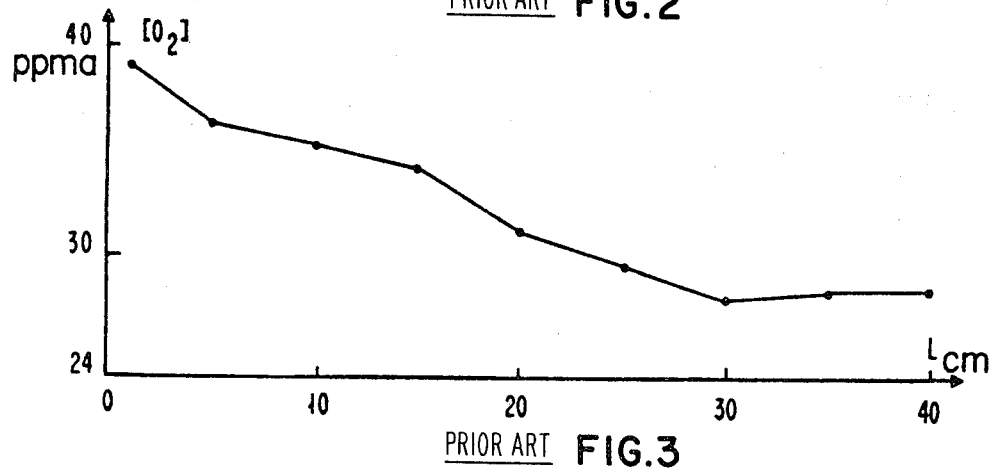
PRIOR ART FIG.3

METHOD FOR CONTROLLING THE OXYGEN LEVEL OF SILICON RODS PULLED ACCORDING TO THE CZOCHRALSKI TECHNIQUE

DESCRIPTION

1. Technical Field

The present invention relates to semiconductor rod pulling according to the Czochralski Technique and more particularly to a method for pulling silicon rods having a controlled level (or concentration) of oxygen atoms.

2. Problem Description and Background Art

The present trend in micro-electronics towards highly integrated semiconductor blocks requires more and more a good knowledge of the solid logic technology for the substrates used. In general, these substrates consist of monocrystalline silicon obtained either by the Czochralski technique or by the floating-zone method.

It is well known that the silicon rods pulled according to the Czochralski technique (hereafter referred to as CZ rods) have a higher oxygen level than the rods obtained by the so-called floating-zone method (hereafter referred to as FZ rods). Furthermore, the Czochralski technique permits pulling large-diameter rods (~15 cm).

The production of monocrystalline rods from silicon by using the Czochralski technique is well-known. In this technique, a crystal seed with the desired crystalline orientation is brought into contact with the free surface of a silicon melt. The melt can also contain certain dopants introduced to modify the electric characteristics of the silicon. The melt is contained in a silica crucible which is heated in such a way that the melting silicon is at its melting point or slightly above. The seed is slowly pulled from the melt in a passive atmosphere such as argon and the silicon solidifies around the seed, thus generating a monocrystal having the same crystalline orientation as the seed. This cylindric monocrystal rod is obtained by rotating the seed during the pulling process. Usually, the pulling speed and the heating power are higher at the beginning in order to cause the monocrystal to shrink. This shrinking suppresses the dislocations resulting from the thermal shock of the seed dipped into the melt. The pulling speed is reduced and the power is diminished in order to cause the rod diameter to grow in cone-form until the required diameter is obtained; this part is called the "rod head." The pulling speed is then maintained constant whereas the heating power is slightly increased in order to compensate for the calorie loss resulting from the growing solid crystal. At the end of the process, the pulling speed and the heating power are again increased so as to form at the crystal end a cone part called the "rod tail."

At the melting point of the silicon (about 1420° C.), the surface of the silica crucible which is in contact with the melt dissolves and oxygen in the form of atoms or oxide penetrates into the melt and hence into the silicon crystal.

The CZ rods have an average oxygen concentration ranging from 15 to 45 ppma (whereas the FZ rods have an average oxygen concentration ranging from 0.01 to 0.5 ppma).

It is to be noted that 1 ppma means that the oxygen concentration in the silicon is $0.5 \cdot 10^{17}$ at/cm$^3$. This high oxygen concentration affects the silicon both as to its electric characteristics and as to its crystalline purity.

With regard to the electrical characteristics, the oxygen atoms tend to diffuse during the pulling process and to cluster thus forming agglomerates; some of the atoms act as donors and thus can play an important role in the type of conductivity and the resistivity of the silicon.

With regard to the crystalline purity, the presence of these agglomerates in the crystalline structure can result in dislocation loops and various other defects which may impair the crystalline quality of the material and hence the reliability of the final product.

However, as long as this phenomenon is under control, it is generally admitted that the presence of oxygen in the silicon substrate is beneficial. These agglomerates will be subsequently used as gettering centers for undesirable impurities in the course of the different heat cycles required for manufacturing integrated circuits. This particular problem is described in detail in the French patent application No. 78 26223 filed on Sept. 8, 1978 by the applicant and entitled: "Method for Increasing the Internal Gettering Effect of Semiconductor Bodies."

It has been found that there are practically two concentration profiles depending on the pulling equipment used. In a first case, which refers to the so-called decreasing profile, the profile of the oxygen concentration decreases from the rod head (near the seed) to the rod tail. In a second case, which refers to the so-called U profile, the profile presents a minimum concentration in the vicinity of the rod center.

In all cases so far known, these profiles are not time-stable for the same equipment.

Furthermore, the required oxygen levels must be adapted to two known large families of semiconductor products: the bipolar and unipolar families for which the heat cycles are basically different in the high temperature steps.

Practically, the problem can be defined as follows:

In a first application to bipolar products, the rod portions whose oxygen level is approximately lower than 35–36 ppma are to be used. In a second application to unipolar products, the rod portions whose oxygen level is approximately higher than 30 ppma are to be used.

The following solutions are known up to now:

A first method consists in slicing all wafers from a CZ rod stabilized at 650° L C. and rectified. These wafers are lapped, then polished, and their oxygen level is measured with IR methods. Finally, the wafers are sorted according to the oxygen specification using a notch on the wafer whose azimuth varies with the position in the crystal. (See the article: "Reference March for Locating a Wafer in Semiconductor Rods," by D. Mallejac, IBM Technical Disclosure Bulletin, Vol. 20, No. 8, January 1978, page 3154). This method can be costly depending on the number of wafers rejected.

The manufacturing line yield can be improved owing to the invention related to the French patent application No. 79 17302 filed on June 29, 1979 by the applicant and entitled: "Method for Characterization of the Oxygen Concentration of Silicon Rods Pulled According to the Czochralski Technique." This application described a sensitive and precise method which permits the characterization of the oxygen concentration of silicon rods in order to process only the rod portion corresponding to the required oxygen concentration.

This method includes the following steps: Slicing a portion about 1 cm thick from the rod head or tail (depending on whether a maximum or minimum oxygen specification is desired), measuring its resistivity, annealing this portion at a temperature ranging from 600° to 900° C. for a sufficiently long time in a neutral atmosphere ($N_2$), chemically etching the surface of the portion in order to clean it and measuring the resistivity increment. It is the value of this measured increment which finally determines the oxygen concentration of the rod. Practically, the temperature ranges from 650° C. to 850° C. and the annealing time from one to six hours.

However, all these methods have the disadvantage of being so-called subsequent rating methods, that is, the rods are manufactured according to the conventional methods mentioned above and the rod portions are rated later on. If a rod is out of specification it is rejected. In all cases, the rod portions not up to specifications are rejected, which represents an important loss for wafer producers.

That is why the applicant had, at the same time, filed an application for the French Pat. No. 76 10161 on Apr. 1, 1976, entitled: "Method for Controlling the Oxygen Concentration in Silicon Crystals."

This application described a method for controlling the oxygen concentration of rods pulled from a silicon melt contained in a silica crucible. This method includes the crucible processing in order to modify the superficial characteristics of the crucible portion in contact with the melt so as to control the oxygen level of the melt during the rod growth process.

In a preferred embodiment of the invention, the surface of the crucible was dulled using a method such as sand blasting.

In another embodiment of the invention the surface of the crucible was submitted to a heat treatment such as flame polishing or to a heat treatment in a furnace.

However, these methods did not prove entirely satisfactory: the processing of the silica crucibles proved to be difficult and a source of contamination (iron and/or copper atoms). The improvement stated was, in effect, only significant at the beginning of the pulling process and consequently impacted only a small portion of the rod head. The remaining part of the rod still required the rating or sorting operations.

A further important method of the prior art is described in the French Pat. No. 76 23756 filed on July 28, 1976 by the applicant and entitled: "Method for Growing a Rod of a Crystalline Material, for Example Silicon, Having a Controlled Oxygen Concentration." This method ensures that the oxygen concentration in the rod is not lower than 28 ppma. The method is based on auto-cleaning of the SiO passivation layer of the crucible walls and hence on reactivation of the oxygen dissolution process in the silicon melt. Unfortunately, this method does not ensure a minimum oxygen concentration of 32 ppma. However, this method is advantageous and it can be used to a large extent.

Finally, reference can be made to the research work of H. J. Scheel, published, for example in the article "Accelerated Crucible Rotation: A Novel Stirring Technique in High Temperature Solution Growth," Journal of Crystal Growth 13/14 (1972) XII.2, pages 560 to 565, which studies the effect of the rotation speeds including acceleration/deceleration cycles for homogenization of the melt. This article does not make any reference to the oxygen concentration control; also, the cycles studied are rather different from those claimed in the present invention.

SUMMARY OF THE INVENTION

A first object of the invention is to provide a method for pulling CZ rods which considerably reduces the need for the rating and sorting steps required by the prior art, and to ensure the oxygen control at pulling time and no longer at sorting time.

Another object of the invention is to provide a method for pulling CZ rods whose oxygen concentration can be controlled very closely according to a desired profile, so as to be near an average value.

Another object of the invention is to provide a method for pulling CZ rods with the required profile, which can be directly used on either unipolar or bipolar production lines.

Still another object of the invention is to provide a method for pulling CZ rods which present a profile of controlled concentration by using a computer to optimize the rotation speeds of the crucible.

The present invention takes advantage of the studies made by the applicant which have shown the relation existing between the crucible rotation speed and the oxygen concentration profile along the rod and more particularly that its control according to a given profile can either provide any profile desired or a practically constant concentration profile. It has been demonstrated that a low crucible rotation speed provides a low oxygen concentration whereas a high rotation speed provides a high oxygen concentration in the rod.

The present invention relates to a method for controlling the oxygen level of a rod being pulled from a melt of a semiconductor material, typically of silicon, contained in a crucible, according to the well-known Czochralski technique, this method being characterized in that the crucible rotation speed during the pulling process is variable in order to provide for an oxygen concentration which is practically constant along the rod.

In one embodiment, the law governing the variation of the crucible rotation speed $V_{Rc}$ at each moment of the pulling process, which corresponds to a rod length L, is the following: the direction of this variation is opposed to the slope of the oxygen concentration curve ($O_2$) which would have been obtained with a fixed crucible rotation Ro. In other words:

$$\text{sign (grad } V_{Rc}) = -\text{sign (grad } (O_2)).$$

For example, if the rod concentration profile obtained with a fixed rotation Ro were linear, that is: $(O_2) = aL + X_s$ (a being a factor depending on the equipment and $X_s$ the concentration near the seed, both being a function of Ro), the value ($O_2$) would be maintained constant and equal to $X_s$, for example by applying to the crucible a rotation speed $V_{Rc} = -bL + Ro$ (b being a factor which is a function of a and of the same sign).

In a preferred embodiment and for a given equipment, the following steps will be executed:
  Setting up a data bank in order to determine the average oxygen concentration ($O_2$) as a function of the length (L), that is, ($O_2$)=f(L), of the rods pulled at a constant rotation speed Ro.
  Controlling the crucible rotation speed during the pulling process so that its slope is opposed to the slope of the average concentration profile at each moment, that is, grad $V_{Rc} = -k$ grad ($O_2$), where k is a positive factor depending on the equipment and on the method, which can be constant or variable.

This method is applied in the process of pulling monocrystalline silicon rods whose oxygen concentration is known exactly in advance.

The invention is described in more detail in the following, and reference is made to the figures which represent a preferred embodiment thereof.

BRIEF DESCRIPTION OF THE FIGURES

FIG. 1 shows the oxygen concentration ($O_2$) as a function of the length L of a rod pulled according to the Czochralski Technique, illustrating a so-called decreasing profile which can sometimes be approximately linear.

FIG. 2 shows the oxygen concentration ($O_2$) as a function of the length L of a rod pulled according to the Czochralski Technique illustrating a so-called U profile.

FIG. 3 shows the oxygen concentration ($O_2$) as a function of the length L of a rod pulled according to the Czochralski Technique illustrating the improvement described in patent No. 76 23756 mentioned above and using a so-called decreasing profile.

PREFERRED EMBODIMENT OF THE INVENTION

I. Introduction

It has been shown (see the above-mentioned French Pat. No. 79 17302) that the oxygen is an essential parameter in the silicon wafer quality, and that the minimum required for the unipolar lines was 30 ppma (in fact between 30 and 33 ppma), whereas the maximum seems to be around 43 ppma (for higher oxygen concentrations, the wafers have a precipitation rate which is too high). For bipolar lines, the silicon wafers must have a concentration lower than about 36 ppma, the minimum ranging from 20 to 23 ppma.

As has been described in the foregoing, the oxygen concentration profiles in the CZ rods are of two different types depending upon the pulling equipment used, that is, the so-called decreasing profile illustrated in FIG. 1 and the U-shaped profile illustrated in FIG. 2. These profiles have been obtained for CZ rods pulled without using the method described in the above-mentioned patent No. 76 23756. These profiles are less characteristic when the method described in this patent is used. Such a profile is shown in FIG. 3 in the case of the so-called decreasing profile. In FIGS. 1 to 3, the rod length (in centimeters) has been plotted on the abscissa and the oxygen level or concentration (in ppma) on the ordinate. The measurements have been made after pulling on wafers obtained from the rods by the IR method.

II. Influence of the Crucible Rotation On the Oxygen Concentration of the Rod

Since the silicon melt seems to dissolve the quartz crucible and since this phenomenon is thermally active, the oxgen level should be related to the different parameters controlling the crucible temperature.

Direct action on the melt temperature or a slow-down of the quartz crucible dissolution process would mean the immediate loss of control over the rod diameter.

Other investigations on the crucible position with relation to the graphite resistance and on the crucible rising speed have shown that the oxygen concentration curves can be affected by these parameters; however, the interval admissible in this method is too narrow to maintain the monocrystalline structure and to avoid the evaporation and the condensation of the silicon vapors above the melt.

In the following, it will be shown that by means of the crucible rotation it is possible to influence the crucible temperature without affecting the other pulling parameters and without losing control over the rod diameter.

1. Preliminary Investigation on the Crucible Rotation Speed ($V_{Rc}$).

Figure 4:
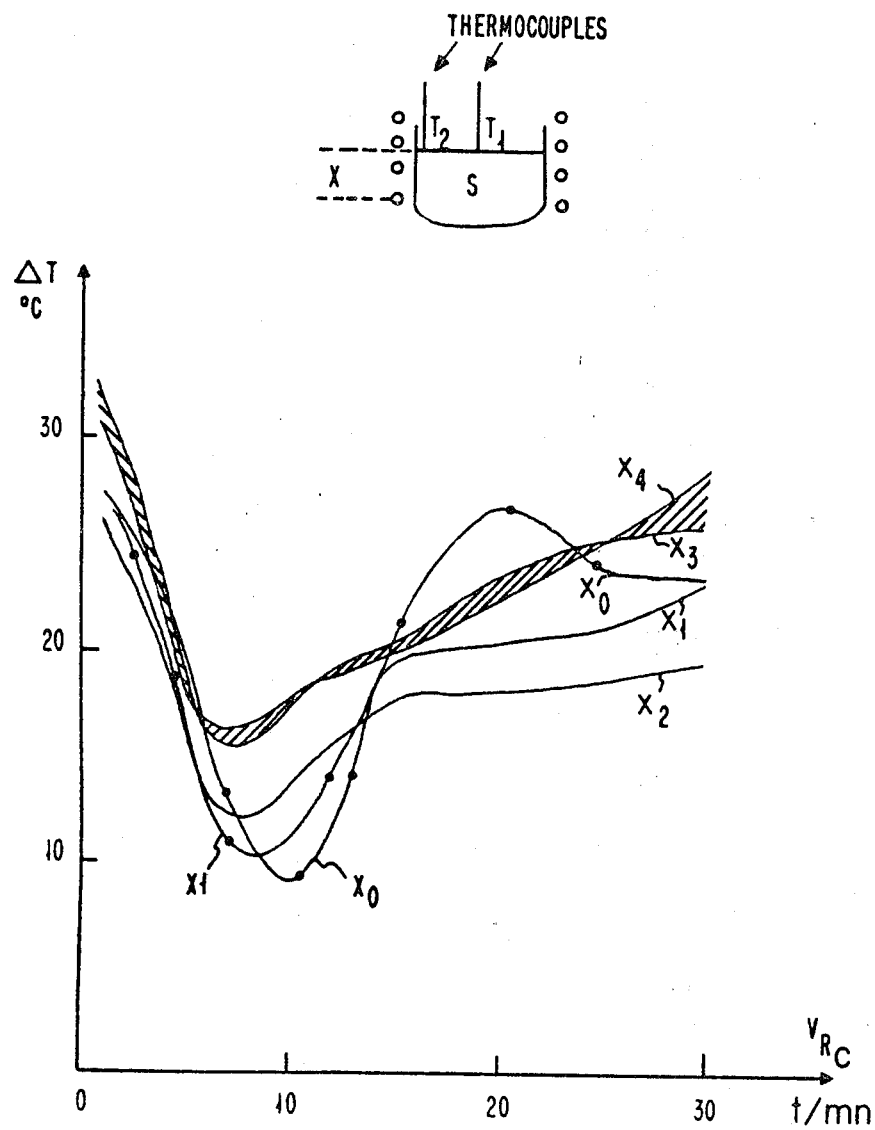
FIG. 4 shows the radial temperature gradient between the center and the rim of the silicon melt for different positions of the crucible within the heating device as a function of the crucible rotation speed $V_{Rc}$.

This parameter which seems to have undergone little study up to now has been studied very closely. Two thermocouples protected by quartz tubes have been arranged in a crucible containing 9 kg of silicon, one near the center and the other near the quartz crucible wall. They were connected to a computer which measured and registered the temperatures every 20 seconds for any modification of the parameters (crucible rotation, starting point, ...). The difference of the temperature between the periphery and the center of the crucible, that is, the radial gradient $\Delta T$ as a function of the crucible rotation $V_{Rc}$ (in turns/min) is shown in FIG. 4.

This figure shows that the gradient $\Delta T$ can be reduced or increased depending on the crucible rotation speed. Although the actual pulling conditions are rather different from the experimental conditions and closely depend on the equipment used, it was possible to extrapolate the following interesting results: For an arbitrary height marked "$X_0$" a rotation of about 10 t/min ensures a minimum $\Delta T$. The crucible temperature and the quartz dissolution will also be minimum and the oxygen concentration of the rod will be limited, whereas a rotation of 25 t/min will have an adverse effect.

The parameter X depicts the crucible engagement in the heating region: if $X_0$ corresponds to a minimum value, $X_4$ corresponds to a medium value, and the hatched region is the desired working region. If parameter X is too small, or on the contrary too high, parts of the rod will be polycrystalline.

In practice, rod manufacturers use a constant rotation speed of about 15 t/min which constitutes a rule-of-thumb average of the two values explained above.

These numeric values correspond of course to a certain type of equipment and are subject to variations.

It should be noted that a maximum $\Delta T$ can also be found for small crucible rotation values. The whole process of controlling the oxygen level by means of the crucible rotation which will be explained in the following would be inverted if small rotation values were used. This does, however, not seem to be judicious because the rod dopant may not be homogeneous. It is, therefore, important to establish a thermal map, that is, the function $\Delta T = f(V_{Rc})$. Practically, the process takes place in the linearly growing part of the curve (10 t/min $\leq V_{Rc} \leq$ 20 t/min) represented by the hatched part and in this and only in this case the speed variation has the sign opposite to that of the concentration profile, which is expressed by the relation grad $V_{Rc} = -k$ grad $(O_2)$; otherwise, the relation would be expressed as:

grad $V_{Rc} = k'$ grad $(O_2)$ where k and k' are two positive proportionally factors.

2. Effect on the Oxygen Concentration

In order to determine in a still more precise manner, the relation between the oxygen concentration and the crucible rotation speed, two rods have been pulled at a rotation speed of 8 t/min and two other rods at a speed of 25 t/min, all other parameters being the same (except in the first case, the seed rising speed where the two values 7.5 cm/h and 10 cm/h have been used).

Figure 5:
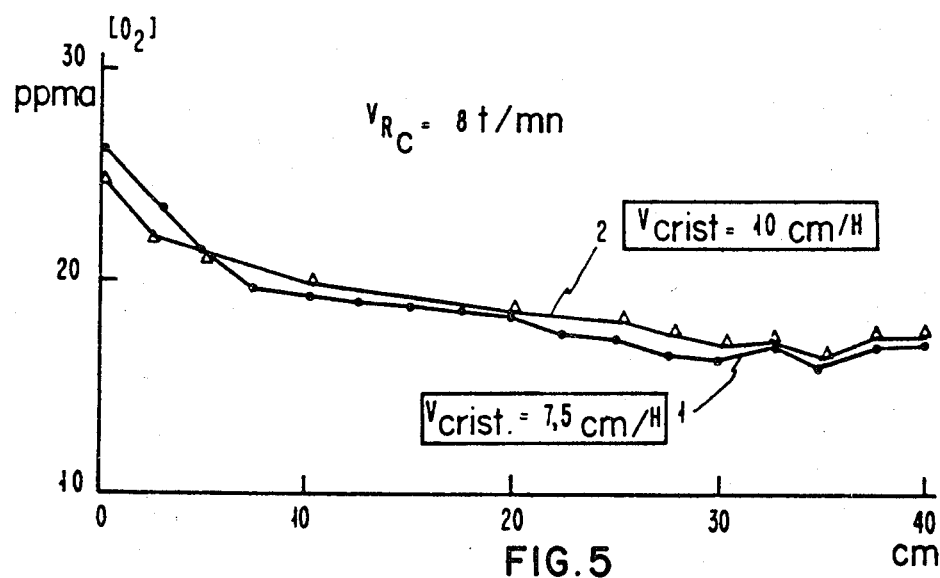
FIG. 5 shows the oxygen concentration ($O_2$) as a function of the length L of two rods pulled according to the Czochralski Technique at a crucible rotation speed of $V_{Rc} = 8$ t/min for two seed rising speeds $V_{cryst} = 7.5$ cm/h and 10 cm/h.
Figure 6:
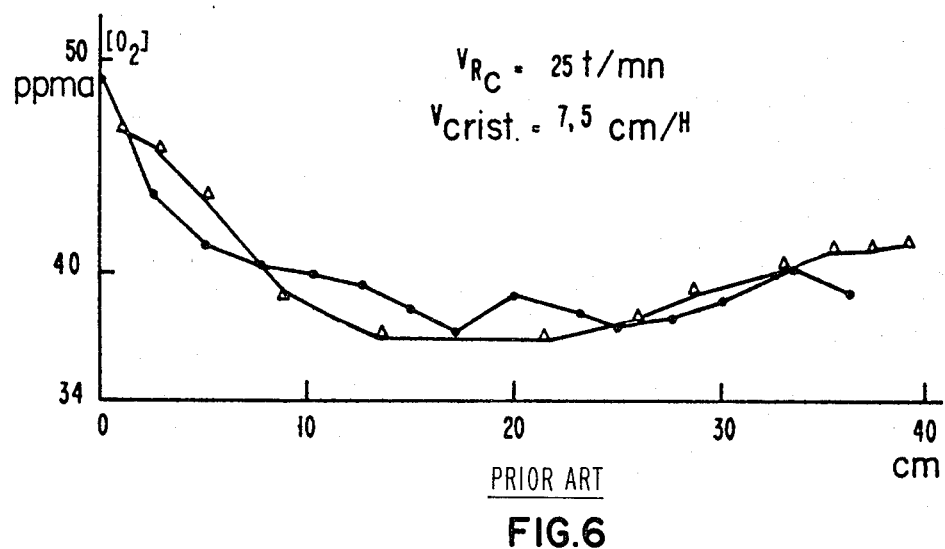
FIG. 6 shows the oxygen concentration ($O_2$) as a function of the length L of two rods pulled according to the Czochralski Technique including the improvement described in the patent application No. 76 23756 at a crucible rotation speed of 25 t/min and a seed rising speed of 7.5 cm/h.

The effects on the oxygen concentration are clearly shown in FIGS. 5 and 6.

FIG. 5 illustrates the oxygen concentration (in ppma) as a function of the rod length (in centimeters); curve 1 obviously shows that with a seed rising speed ($V_{cryst}$) of 7.5 cm/h and a $V_{Rc}$ of 85/min, the oxygen concentration varies between 16 and 26 ppma along the rod (U profile). The greater part of the rod has an oxygen concentration of less than 20 ppma. Curve 2 ($V_{cryst}=10$ cm/h) simply shows that the seed rising speed factor does not seem to be determinant for the oxygen concentration of the CZ rod.

On the contrary, FIG. 6 shows that at a seed rising speed identical with that of curve 1 (7.5 cm/h) but at a rotation speed $V_{Rc}$ of 25 t/min, the oxygen concentration varies between 37 and 50 ppma along the two rods pulled during this experiment.

It must be noted that the rods with a high oxygen level have severe resistivity problems. The donor states provided by the oxygen atoms show up from 30 ppma on if the material is annealed above 600° C. The problem becomes more serious as the processing temperatures and the oxygen concentration increase.

3. Application to the Control of the Oxygen Concentration of CZ Rods

FIGS. 5 and 6 show the important part played by the rotation speed in the oxygen concentration profile, the oxygen level depending, to a great extent, on the rotation speed. In general, it is desirable to obtain a flat concentration profile or one with slight variations around a desired average value.

Instead of having a fixed rotation speed for the total duration of the cycle, the crucible will rotate according to a variable speed determined by the slope of the foreseeable oxygen concentration profile. In other words, when the oxygen concentration diminishes, the crucible rotation will be accelerated and vice versa. As a matter of fact, the speed variations will be sufficiently progressive in order not to cause defects (diameter variations, polycrystalline regions, ...). A computer can be used to facilitate calculations. The maximum speed increment chosen for the equipment of the applicant if 0.1 t/min, but other values can obviously be used according to the operation conditions.

Unfortunately, no method for measuring the oxygen level of a rod in the process of being pulled is known to date; the data bank can therefore only be set up some days after pulling. The profiles shown in FIGS. 5 and 6 are, for example, only available rather late. However, the profile can be analyzed for deduction of an average profile. For example, FIG. 6 shows the order of magnitude of the variations between two rods pulled at an interval of some days. This approximate average profile can vary with time and the analysis of the profile rotation speed should take this into account. It should be noted that if such an online measuring method were to be developed, the present control method could be effective immediately and correct the oxygen level in the desired manner in order to obtain a virtually flat profile.

Figure 7A:
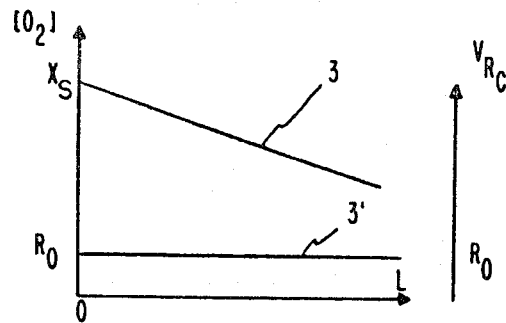
FIGS. 7A, B, C and D illustrate the principle of correcting the oxygen concentration ($O_2$) of a CZ rod if the profile were normally decreasing (FIGS. 7A and 7B) and took the form of an U (FIGS. 7C and 7D), at a constant crucible rotation speed $V_{Rc}$.
Figure 7B:
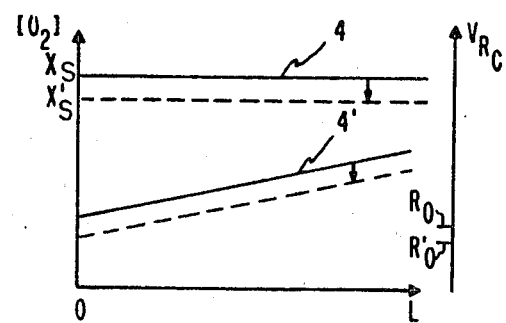

However, as shown in the foregoing, these theoretical profiles are never found in practice. In fact, the principle of the present method can be understood schematically by means of FIGS. 7A to 7D. While a constant rotation speed (Ro) indicated by 3' results, with the equipment used, in a linear concentration profile indicated by 3 in FIG. 7A (so-called decreasing profile), a rotation speed increasing linearly whose profile is indicated by 4' (see FIG. 7B) results in a flat concentration profile 4. This figure also shows the influence of the starting speed on the average oxygen level (dotted profiles).

Figure 7C:
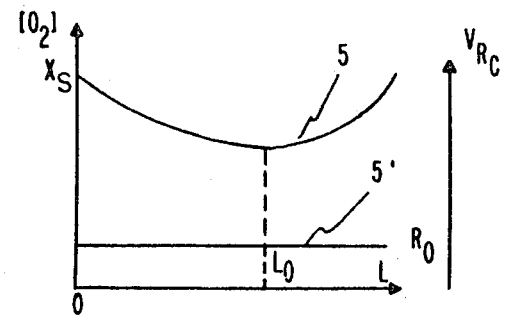
Figure 7D:
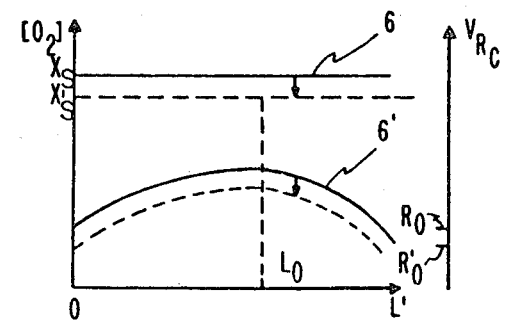

A so-called U concentration profile (5) such as shown in FIG. 7C, obtained when the rotation speed $V_{Rc}$ is constant (5'), results in a flat concentration profile (6) if a symmetrical rotation speed profile (6') is used in $\eta$. Here too, the influence of the starting speed is shown by the dotted profiles in FIG. 7D.

The mathematical rule to be followed in approximately:

$$\text{grad } V_{Rc} = -k \text{ grad } (O_2)$$

where k is a positive proportionality factor depending on the operating conditions which may be constant for certain applications.

4. Practical Application Examples

Products intended for the unipolar manufacturing line require wafers with an oxygen concentration ranging from 34 to 42 ppma, that is, having an average value of 38 ppma.

It was therefore necessary to determine, by rule of thumb, the best profile of the rotation speed in order to obtain the flattest possible concentration profile in the vicinity of the desired value.

Figure 8:
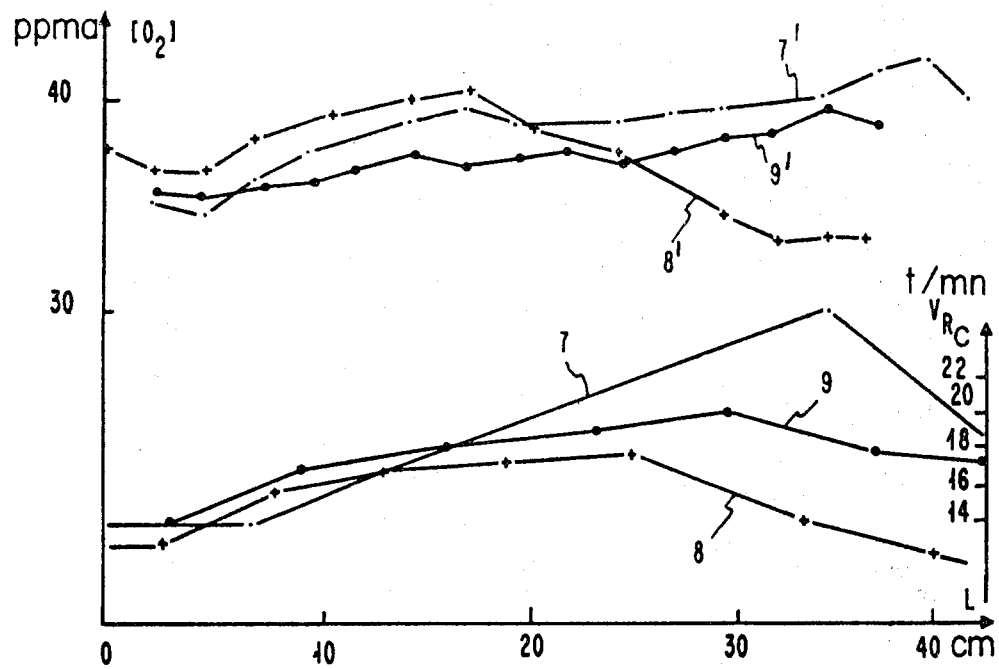
FIG. 8 shows different oxygen concentration profiles in CZ rods as a function of length L, pulled at the different corresponding crucible rotation speeds represented in the lower part of the figure.

FIG. 8 shows some attempts of determining a profile with an optimum speed. The speed profiles indicated by the numbers 7, 8, 9 in the lower part of FIG. 8 have resulted respectively in the concentration profiles indicated by 7', 8', 9' in the upper part of this figure. It can be seen in particular that for profile 9 the oxygen concentration (curve 9') is comprised between 35 and 40 ppma and hence meets the specification.

Figure 9:
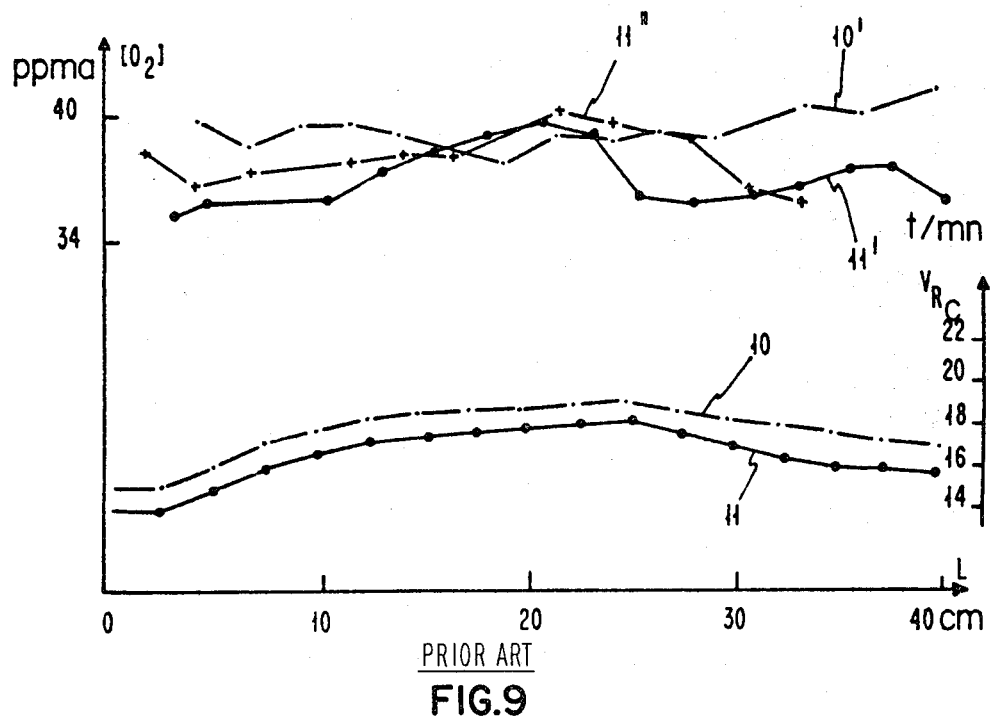
FIG. 9 shows different oxygen concentration profiles as a function of length L in the CZ rods including the improvement described in the aforementioned patent application No. 76 23756, at the different corresponding crucible rotation speeds illustrated in the lower part of the figure.

In FIG. 9 where a concentration profile very close to the value of 40 ppma was to be obtained, the speed profile indicated by 10 resulted in a rod which had the concentration profile indicated by 10', that is, a concentration value between 38 and 41 ppma.

The problem of undesirable and uncontrollable variations mentioned above is also illustrated in FIG. 9. Two rods have been pulled with the same speed profile 11; they presented the concentration profiles 11' and 11''. It can, however, be noted that the concentrations are in both cases comprised between 35 and 40 ppma, hence relatively precise, above all when compared with the profiles currently obtained with the known techniques which are illustrated in FIGS. 1 to 3. It can also be noted that the speed profile indicated by 11 ensures a shift towards lower concentrations when compared with profile 10. A comparison of curve 10' with curves 11' and 11'' makes evident the resulting action as regards the oxygen concentrations.

The numeric results are given in Table 1.

TABLE 1

| Resulting Rod | (O$_2$) ppma | | | | | LENGTH (cm) |
|---|---|---|---|---|---|---|
| | MIN | MAX | HEAD | AVERAGE | 3σ/ AVERAGE | |
| Reference 10/10' | 37.6 | 41.4 | 40 | 39.4 | 7% | 40 |
| Reference 11/11' | 35.2 | 39.9 | 35.5 | 37.0 | 11,3% | 43 |
| Reference 11/11'' | 35.8 | 40.2 | 38.2 | 38.1 | 10,8% | 34 |
| Method with V$_{Rc}$ constant | 32 | 40 | 37 | 35 | 20% | 40 |

The speed profile indicated by 11 can therefore be used for pulling rods intended for a unipolar manufacturing line with specifications ranging from 33 to 43 ppma.

Figure 10:
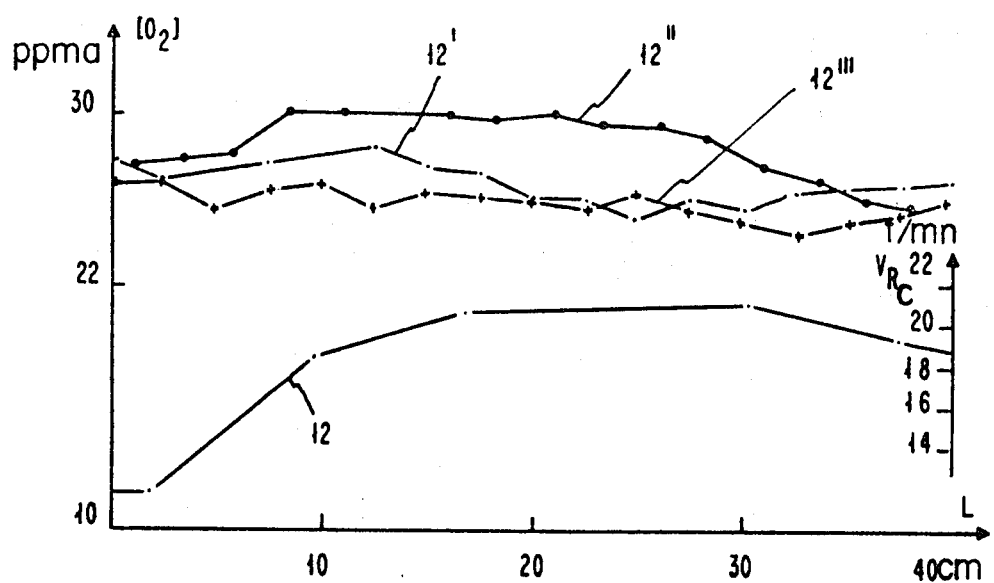
FIG. 10 shows different oxygen concentration profiles as a function of length L in the CZ rods pulled at the different corresponding crucible rotation speeds illustrated in the lower part of the figure.

For products intended for a bipolar manufacturing line requiring wafers with an oxygen concentration ranging from 22 to 32 ppma or an average value of 26 ppma, the profile shown in FIG. 10 has been chosen in the same way after various iterations. With this profile 13, three rods have been pulled; the corresponding concentration profiles are indicated by 12', 12'' and 12'''. The results are given in Table 2.

TABLE 2

| Resulting Rod | (O$_2$) ppma | | | | | LENGTH (cm) |
|---|---|---|---|---|---|---|
| | MIN | MAX | HEAD | AVERAGE | 3σ/ AVERAGE | |
| Reference 12/12' | 24.8 | 28.5 | 27.7 | 26.5 | 10,5% | 50 |
| Reference 12/12'' | 24.1 | 28.6 | 26.8 | 25.8 | 11,2% | 48 |
| Reference 12/12''' | 25.5 | 30.1 | 27.5 | 28.1 | 15% | 48 |
| Method with V$_{Rc}$ constant | 21 | 34 | 35 | 25 | 35% | 48 |

This profile seems to be in conformity with the production of rods specifying from 22 to 32 ppma. The rotation speed according to a predetermined profile (such as 12) can be controlled without any difficulty owing to the use of a computer which has this profile in storage.

Figure 11:
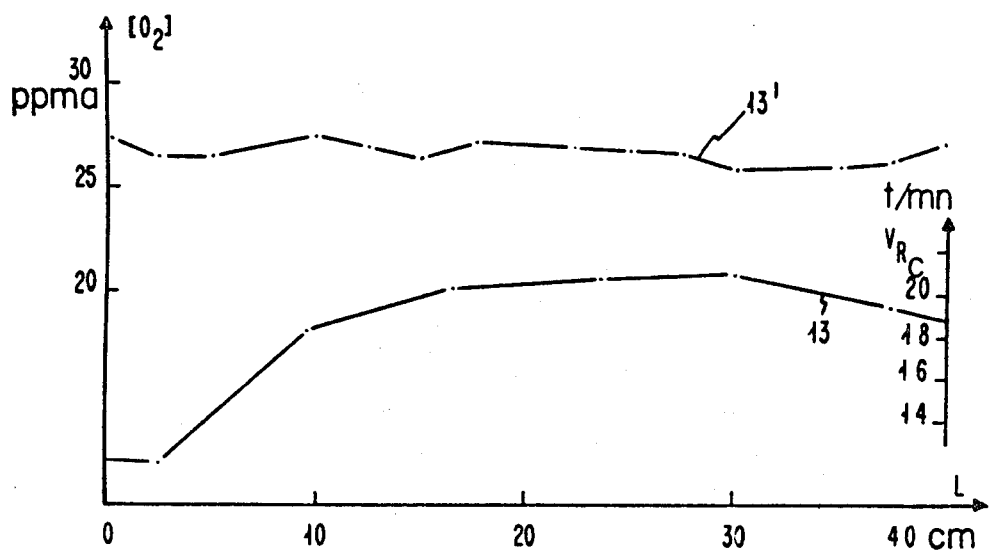
FIG. 11 shows a particularly flat oxygen concentration profile in a CZ rod pulled at a crucible rotation speed which has followed the speed profile represented in the lower part of the figure.

A particularly flat oxygen concentration profile is shown in FIG. 11. This profile 13' is obtained by using the rotation speed profile 13 and a seed rising speed of 10 cm/h. It can be seen that the oxygen concentration is about equal to 27.5 ppma over the whole length of the rod (40 cm).

In conclusion, the method of the present invention allows manufacturing CZ rods according to specifications much more precise than those of the prior art; in addition, the average value of the oxygen concentration (O$_2$) can be chosen from a large range. The present method therefore meets the requirements of both bipolar and unipolar applications.

However, there are some limitations. For example, the optimum profile has been obtained by a rule-of-thumb method, and the concentration profiles are different for each rod without knowing the reason, as has been demonstrated above.

Nevertheless, the present method could be used in real time should it become possible to measure the oxygen concentration of the rod.

The present method can also be used for materials other than silicon and for the control of constituents other than oxygen. For example, in the GGG technology (gadolinium-gallium, garnet) it is possible to control the iridium concentration of the crucible.

While the invention has been particularly shown and described with reference to a preferred embodiment thereof, it will be understood by those skilled in the art that numerous changes in form and detail may be made therein without departing from the spirit and scope of the invention.

We claim:

1. An improved method for the production of a silicon monocrystalline rod grown according to the Czochralski method, in which the oxygen content (O$_2$) is relatively high and maintained substantially constant throughout the length, L, of the rod at a desired value, the improvement comprising:
    determining the average oxygen content profile (O$_2$) of the rod specific to the pulling equipment used when grown with a constant crucible rotation speed (V$_{RC}$)$_O$=R$_O$, and
    controlling the crucible rotation speed V$_{RC}$ during the pulling so that its slope is opposite to the slope of the previously measured average oxygen concentration profile.

2. A method as described in claim 1 including the step of controlling the rotation speed by a computer which has the required rotation speed profile in memory.

3. A method as described in claim 1 including the steps of increasing the rotational speed during the whole processing.

4. A method as described in claim 1 including the steps of increasing the rotational speed while the first third of the rod is being formed, maintaining a constant speed while the second third of the rod is being formed and decreasing the speed while the remaining third of the rod is formed.

* * * * *